(12) United States Patent
Seedher et al.

(10) Patent No.: US 9,025,791 B2
(45) Date of Patent: May 5, 2015

(54) POP-UP NOISE REDUCTION IN A DEVICE

(75) Inventors: Ankit Seedher, Banaglore (IN); Raja J. Prabhu, Bangalore (IN); Shyam S. Somayajula, Bangalore (IN)

(73) Assignee: ST-Ericsson SA, Plan-les-Ouates (CH)

( * ) Notice: Subject to any disclaimer, the term of this patent is extended or adjusted under 35 U.S.C. 154(b) by 486 days.

(21) Appl. No.: 13/512,593

(22) PCT Filed: Nov. 30, 2009

(86) PCT No.: PCT/IN2009/000693
§ 371 (c)(1),
(2), (4) Date: Jul. 9, 2012

(87) PCT Pub. No.: WO2011/064787
PCT Pub. Date: Jun. 3, 2011

(65) Prior Publication Data
US 2012/0274399 A1 Nov. 1, 2012

(51) Int. Cl.
*H04B 15/00* (2006.01)
*H03F 3/217* (2006.01)
*H03F 1/30* (2006.01)

(52) U.S. Cl.
CPC ............... *H03F 3/217* (2013.01); *H03F 1/305* (2013.01)

(58) Field of Classification Search
CPC ....... H03F 1/34; H03F 1/305; H03F 2200/03; H03G 3/348; H03G 3/345; G11B 20/10527
USPC .................. 381/94.1, 94.5; 330/104
See application file for complete search history.

(56) References Cited

U.S. PATENT DOCUMENTS

| | | | |
|---|---|---|---|
| 6,049,246 A * | 4/2000 | Kozisek et al. | 330/9 |
| 6,316,992 B1 | 11/2001 | Miao et al. | |
| 6,396,430 B1* | 5/2002 | Li | 341/155 |
| 6,700,518 B2 | 3/2004 | Kishida | |
| 7,142,047 B2 | 11/2006 | Sahandiesfanjani et al. | |
| 2003/0119464 A1* | 6/2003 | Toyoda et al. | 455/245.1 |
| 2006/0202754 A1* | 9/2006 | Yamamura et al. | 330/75 |
| 2007/0139109 A1* | 6/2007 | Honda et al. | 330/251 |
| 2007/0273437 A1* | 11/2007 | Kaiho et al. | 330/10 |
| 2008/0018393 A1* | 1/2008 | Tanaka et al. | 330/9 |
| 2008/0024213 A1* | 1/2008 | Magrath | 330/96 |
| 2011/0043286 A1* | 2/2011 | Youngblood | 330/295 |

FOREIGN PATENT DOCUMENTS

JP 2008017358 1/2008

* cited by examiner

*Primary Examiner* — Simon Sing
(74) *Attorney, Agent, or Firm* — Coats & Bennett, PLLC

(57) ABSTRACT

A device implementing a scheme for reduction of pop-up noise is disclosed. The device comprises an audio sub-system (100) having an integrator (112) for amplifying an input signal (133) and a modulation circuit (114) including one or more comparators. The audio subsystem (100) is further provided with a feedback loop (142) across the integrator (112) and the modulation circuit (114) to calibrate an offsets outputs of the integrator (112) and the modulation circuit (114). The feedback loop (142) includes an integrator-offset loop (202) across the integrator (112) to calibrate an offset (136) in the output of the integrator (112), and an offset calibration loop (302) across the modulation circuit (114) to calibrate an offset (140) in the output of the modulation circuit (114).

19 Claims, 4 Drawing Sheets

POP-UP NOISE REDUCTION IN A DEVICE

TECHNICAL FIELD

The present subject matter relates, in general, to pop-up noise reduction in a device and, in particular, to calibrating offsets in the device.

BACKGROUND

Electronic devices, such as communication devices and home entertainment devices, include an audio sub-system for providing an audio output. The audio sub-system generally includes an input device to provide audio signals, an audio amplifier to amplify the audio signals received, and one or more speakers to produce an amplified sound. Audio amplifiers used for amplifying audio signals are generally classified into various classes including A, B, AB, C, and D. Class-D amplifiers, in particular, have an advantage of providing high-efficiency audio output at minimum power loss and are, thus, preferred in applications where power efficiency is important, such as in battery powered and portable applications.

A class-D amplifier is a switching amplifier and typically includes an integrator, a modulation circuit, and a driver circuit in a feedback configuration. The integrator pre-amplifies a feedback error signal and provides a pre-amplified audio signal to one or more comparators of a modulation circuit. The modulation circuit converts the amplified audio signal into a pulse width modulated (PWM) signal using a variety of schemes known in the art. Further, the PWM signal is fed to the driver circuit, which provides an amplified audio signal to the speakers.

The various components of the class-D amplifier, such as the integrator, the comparators, and the driver circuit are generally implemented using operational amplifiers. However, operational amplifiers often generate voltage offset due to fabrication imperfections. Moreover, as the components are generally small in size, it is difficult to achieve appropriate matching between the components. As a result, in certain conditions such as powering-up of the electronic device, some spurious signals are introduced at the inputs of the speaker. Such spurious signals amount to a pop-up noise in the speaker during powering-up or un-muting of the electronic device. Typically, the pop-up noise caused due to the mismatch in the driver circuit is reduced by pre-biasing the driver circuit while enabling a normal operating mode of the speakers. However, pre-biasing the driver circuit does not reduce the pop-up noise caused by the offsets in the integrator or the comparators.

SUMMARY

This summary is provided to introduce a scheme for reduction of pop-up noise audible in a speaker of a device such as communication devices including cell-phones, audio/video reproduction devices, or a home entertainment system. These concepts are further described below in the detailed description.

In one embodiment, the device includes an audio sub-system having an integrator for pre-amplifying an input signal and a modulation circuit to modulate the pre-amplified signal into a pulse signal. The audio subsystem is provided with a feedback loop across the integrator and the modulation circuit to calibrate offsets in the integrator and the modulation circuit. The feedback loop includes sub feedback loops, such as integrator-offset loops across the integrator and comparator-offset loops across the modulation circuit.

BRIEF DESCRIPTION OF THE DRAWINGS

The detailed description is described with reference to the accompanying figures. In the figures, the left-most digit(s) of a reference number identifies the figure in which the reference number first appears. The same numbers are used throughout the drawings to reference like features and components.

DETAILED DESCRIPTION

Figure 1:
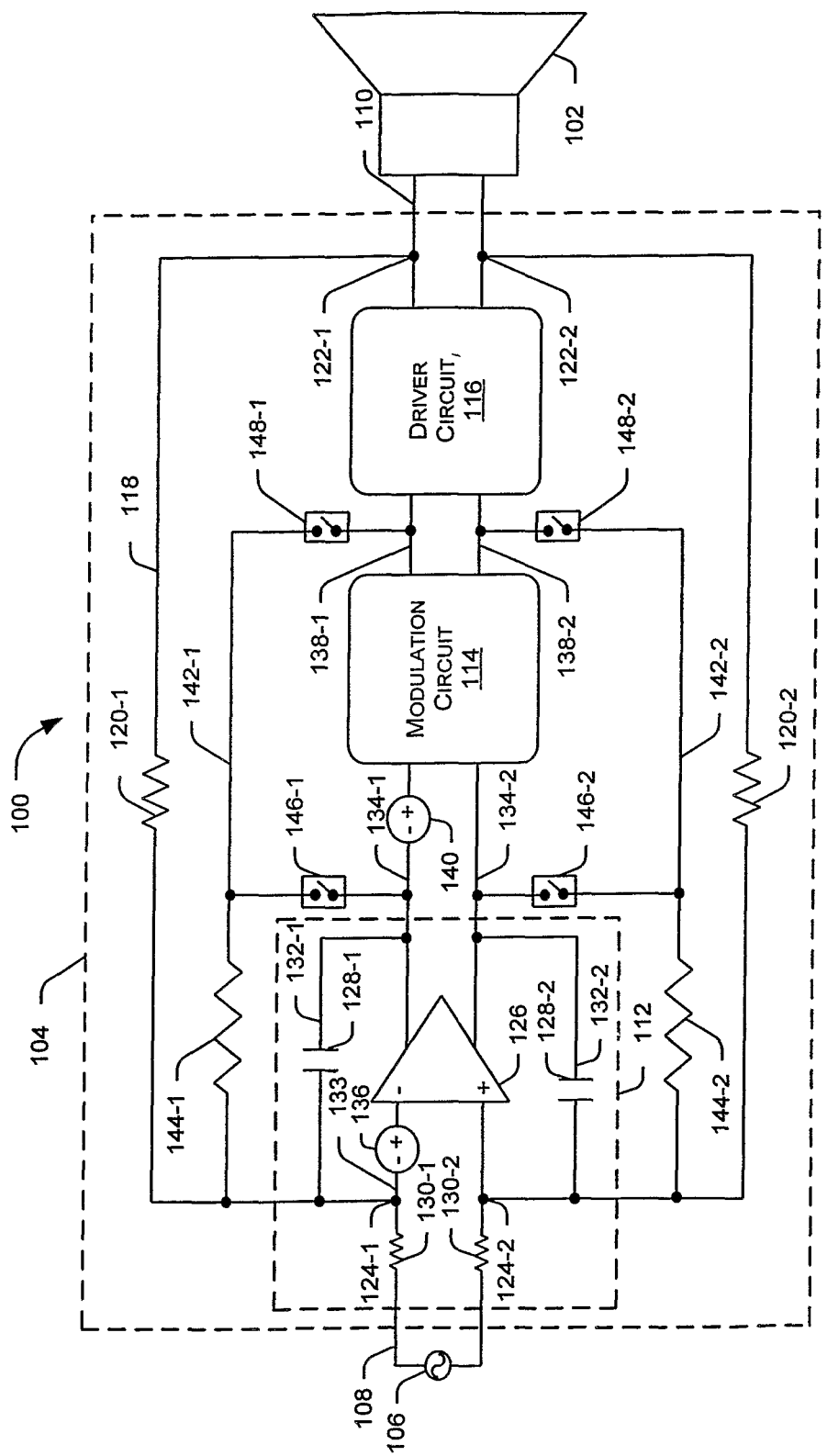
FIG. 1 illustrates an exemplary audio subsystem implementing a scheme for reduction of a pop-up noise due to an audio amplifier, according to an embodiment of the present subject matter.

The disclosed subject matter relates to a scheme for reduction of pop-up noise audibly produced from speakers of electronic devices. The examples of electronic devices include cell-phones, audio/video players, laptops, computing devices, and home entertainment system. Each of such devices include an audio subsystem having a speaker and an audio amplifier associated with the speaker. A pop-up noise may be produced during powering-up or un-muting of the device due to various reasons including inherent mismatches in components of the audio amplifier associated with the speaker. In one embodiment, a class D amplifier is used as the audio amplifier for providing amplification of input audio signals. The class D amplifier as described herein includes an integrator, a modulation circuit including one or more comparators, and a driver circuit for driving a load, such as the speaker, in a feedback configuration.

The integrator receives an audio signal provided as an input to the audio amplifier and a feedback signal from the driver circuit. The integrator is used to pre-amplify a feedback error signal, i.e., a difference of the audio signal and the feedback signal. The integrator thus provides an amplified audio signal to the comparators of the modulation circuit, which convert the amplified audio signal into a pulse width modulated (PWM) signal through schemes known in the art. The PWM signal is amplified by the driver circuit before being provided to the speaker. The integrators and the comparators, being operational amplifiers, have errors called offsets. These offsets are inherent to an operational amplifier.

An offset is generally caused due to a mismatch at an input stage of the operational amplifier, which in turn leads to an error in the output voltage. For example, a non-zero output voltage may be generated at the output of the operational amplifier even when no input signal is provided. The offsets in the integrator and the comparators, appearing across the speaker, are audible during powering-up or un-muting of the device. Such offsets generate the pop-up noise, which is usually an unpleasant and undesirable disturbance.

In an embodiment, the pop-up noise can be reduced by correcting the offsets of the integrator and the comparators using a controller and feedback loops, such as offset correction loops. While implementing the offset correction loops, the driver circuit is kept in a high impedance state, i.e., the speaker is disconnected from the audio subsystem so that the offset correction loops can calibrate the offsets without causing the pop-up noise. In said embodiment, the offset correction loops include resistors and switches, thereby providing a simple and low-cost solution.

As the offset correction loop operates at the wake-up of the device, the offset is corrected before the actual audio signal is provided. Moreover, since the driver circuit is in a high impedance state during offset calibration, the offset does not appear across the speaker, thus ensuring that nothing plays on the speaker during the entire calibration period. Additionally, such offset correction loops can be used in devices, such as mobile phones and audio systems, that have an inbuilt control circuitry, since the same control circuitry may be configured to control the operation of the offset correction loops. Thus, no additional components may be required.

Exemplary Systems

FIG. 1 illustrates an exemplary audio subsystem 100 implementing a scheme for reducing pop-up noise that may be audible at the output of a speaker 102 due to offsets occurring in an audio amplifier 104 associated with the speaker 102. In one embodiment, the audio subsystem 100 includes the speaker 102, the audio amplifier 104 and an input source 106. The audio amplifier 104 receives an input audio signal (Vin) 108 from the input source 106. The audio amplifier 104 amplifies the Vin 108 to provide an amplified differential output signal (Vamp) 110 for driving a load such as the speaker 102. In said embodiment, the audio amplifier 104 is a class-D amplifier used for amplifying audio signals. Typically, the audio subsystem 100 can be used in various home entertainment and communication devices, such as telephones, mobile phones, audio/video players, amplification systems, laptops etc.

In one implementation, the audio amplifier 104 includes an integrator 112, a modulation circuit 114, and a driver circuit 116 to drive the speaker 102. Further, a first feedback loop 118 including feedback resistors 120-1 and 120-2, collectively referred to as feedback resistors (Rf) 120, is provided across the audio amplifier 104. The first feedback loop 118 is used to feed the Vamp 110 (sensed at output terminals 122-1 and 122-2) back to input terminals 124-1 and 124-2 of the audio amplifier 104. Thus, the first feedback loop 118 stabilizes the output Vamp 110 of the audio amplifier 104 at the speaker 102 by providing a negative feedback.

In one embodiment, the integrator 112 includes an operational amplifier 126, a pair of capacitors 128-1 and 128-2, collectively referred to as capacitors 128, and a pair of input resistors (Ri) 130-1 and 130-2. In one implementation, the operational amplifier 126 is implemented as a differential amplifier. The capacitors 128-1 and 128-2 are provided in integrator feedback loops 132-1 and 132-2, collectively referred to as integrator feedback loops 132. The integrator 112 is provided an input signal 133 such as the Vin 108 or a feedback error signal, i.e., the difference of the Vin 108 and the Vamp 110. The integrator 112 pre-amplifies the input signal 133 and provides differential output signals Vop 134-1 and Vom 134-2, collectively referred to as output voltages Vo 134. The output voltages Vo 134 are provided as inputs at two input terminals of the modulation circuit 114. It will be apparent that being differential signals, Vom 134-2 is inverse of the Vop 134-1.

Generally, the output voltages Vo 134 are associated with an offset voltage Vi 136, which is an error in the output of the integrator 112. This offset is inherent to an operational amplifier and is generally caused due to mismatch at inputs of the operational amplifier leading to an error in the output voltage. The error in the output voltage may be manifested, for example, in the form of a non-zero output voltage even when no input signal is provided to the operational amplifier. Additionally, the offset may also be caused due to imperfections during fabrication of the operational amplifier.

Further, the modulation circuit 114 includes one or more comparators (not shown in the figure) and a signal generator (not shown in the figure), such as a triangle wave generator or a saw tooth wave generator. In one embodiment, the modulation circuit 114 includes two comparators, namely a first comparator and a second comparator, which are implemented using operational amplifiers. Each of the comparators compares one of the voltage signals Vop 134-1 and Vom 134-2 with a reference signal (Vref), which may be a triangular waveform or a saw-tooth waveform. The comparators compare the Vref and the Vo 134 to produce a differential pulse width modulated signal Vpwm 138 as an output of the modulation circuit 114. For example, the first comparator generates a first Vpwm 138-1 by comparing the Vref and the Vop 134-1. Similarly, a second Vpwm 138-2 is generated by comparing the Vref and the Vom 134-2. The pulse width modulated signal Vpwm 138 is provided as input to the driver circuit 116.

An offset in the comparators results in an error in the output, i.e., the pulse width modulates signal Vpwm 138 generated from the comparators. The comparators, i.e., the first comparator and the second comparator have individual offsets inherent to an operational amplifier. The individual offsets due to the comparators result in an effective offset voltage Vc 140 observable in the output of the comparators since the output is in the form of the differential pulse width modulated signal Vpwm 138.

Further, the driver circuit 116 includes power transistors (not shown in the figure) that amplify the Vpwm 138 and provide the amplified signal Vamp 110 to the speaker 102. In certain conditions, such as during powering-up or un-muting of the audio amplifier 104, spurious signals usually appear at inputs of the speaker 102, such as at the points 122-1 and 122-2, amounting to a pop-up noise. Such spurious signals may surface due to a mismatch in the driver circuit 116 or offset Vi 136 of the integrator 112 or offset Vc 140 of the comparators or a combination thereof. The pop-up noise caused due to the mismatch in the driver circuit 116 can be reduced by pre-biasing the driver circuit 116 before enabling a normal operating mode of the audio amplifier 104, as discussed. The normal operating mode of the audio amplifier 104 is the mode where the audio amplifier 104 is powered up and is receiving the input signal Vin 108.

In one embodiment of the present subject matter, feedback loops, such as offset correction loops 142-1 and 142-2, collectively referred to as offset correction loops 142, are provided across the integrator 112 and the modulation circuit 114 to calibrate the offset voltages Vi 136 and Vc 140. The offset correction loops 142-1 and 142-2 feed the output voltages Vo 134 and Vpwm 138 to input ports of the integrator 112 and the modulation circuit 114, respectively. The offset correction loops 142-1 and 142-2 include resistors 144-1 and 144-2, collectively referred to as resistors 144, a first pair of switches 146-1 and 146-2, and a second pair of switches 148-1 and 148-2. In an implementation, the resistors 144 are identical to the feedback resistors Rf 120, i.e., the resistors 144 and 120 provide the same amount of resistance.

The offset calibration is provided in two stages that can occur sequentially. For the first stage of offset calibration, the modulation circuit 114 is powered down, and the driver circuit 116 and the speaker 102 are put in the high impedance state. The offset Vi 136 is calibrated by enabling the first pair of switches 146-1 and 146-2, collectively referred to as the first pair of switches 146. The calibration of Vi 136 will be explained later during the explanation of FIG. 2. In the second stage, the offset Vc 140 is calibrated by disabling the first pair of switches 146 and enabling the second pair of switches 148-1 and 148-2, collectively referred to as the second pair of switches 148. The calibration of Vc 140 will be explained later during the explanation of FIG. 3.

After calibration of the offset Vc 140, the second pair of switches 148 is disabled and the audio amplifier 104 is put in the normal operating mode. In an implementation, the first pair of switches 146 and/or the second pair of switches 148 can be controlled by a controller, such as a digital controller (not shown in this figure). In another implementation, the first pair of switches 146 and/or the second pair of switches 148 can be hardwired.

Figure 2:
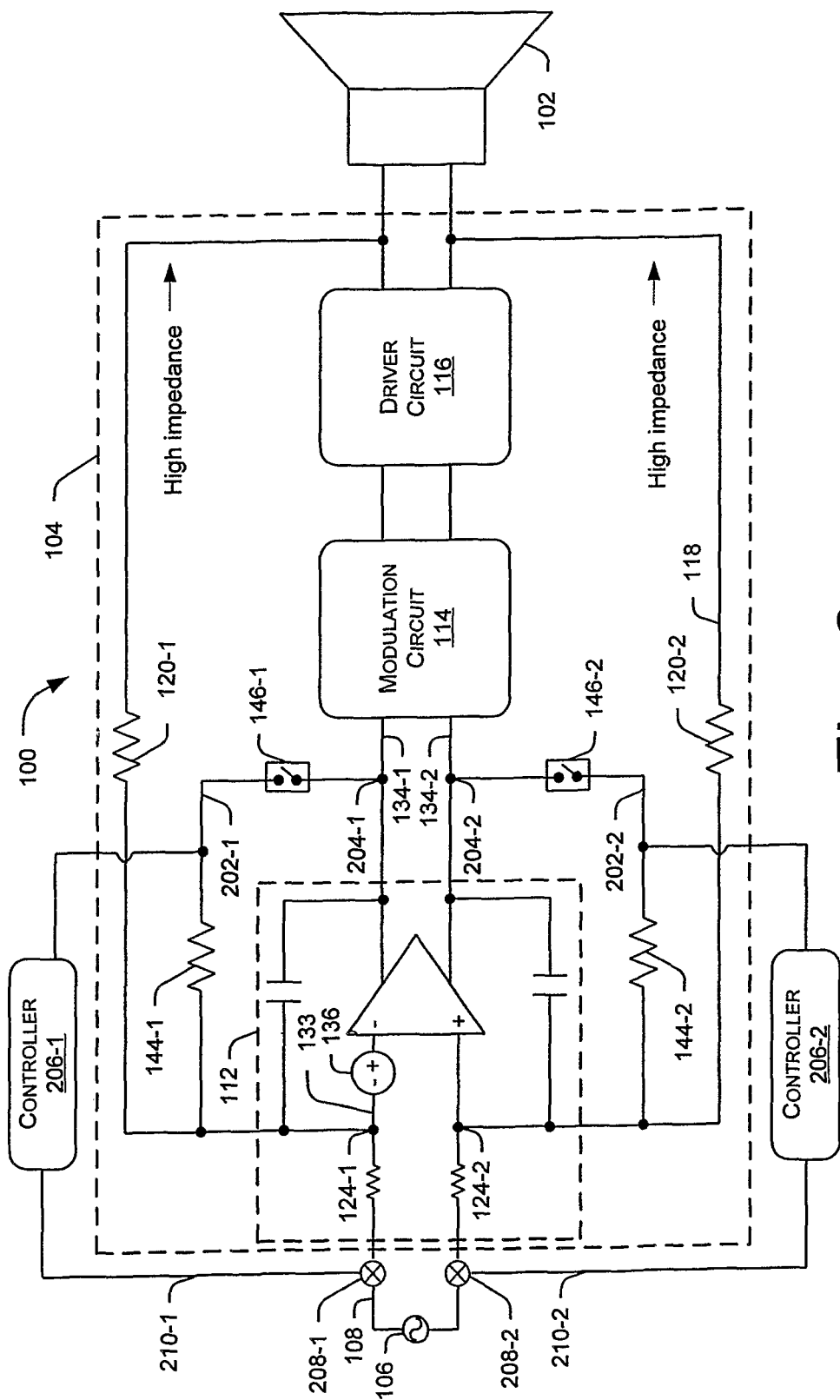
FIG. 2 illustrates an exemplary audio subsystem implementing a scheme for offset calibration of an integrator, according to an embodiment of the present subject matter.

FIG. 2 illustrates the exemplary audio subsystem 100 implementing a scheme for offset calibration of the integrator 112, according to an embodiment of the present subject matter. As explained earlier, the offset calibration for the audio amplifier 104 is done in two stages. In the first stage, calibration of the offset Vi 136 of the integrator 112 is done. The offset Vi 136 appears across the speaker 102 causing a pop-up noise in an output of the speaker 102 during powering-up or un-muting of the audio amplifier 104. As discussed, to prevent the pop-up noise at the speaker 102, the offset correction loops 142 are provided in the audio amplifier 104.

In one embodiment, the offset correction loops 142 include sub-feedback loops, such as a first integrator-offset loop 202-1 and a second integrator-offset loop 202-2, collectively referred to as integrator-offset loops 202. The integrator-offset loops 202 include the resistors 144 and the first pair of switches 146. The integrator-offset loops 202 are used for detecting offset Vi 136 in output Vo 134 of the integrator 112 during powering-up or un-muting, i.e., before the audio amplifier 104 is put in the normal operating mode.

For the purpose, the modulation circuit 114 is powered down and the driver circuit 116 is put in a high impedance state by a controller, such as a digital controller 206, to prevent the transfer of the offset Vi 136 to the speaker 102. In one implementation, the driver circuit 116 is put in the high impedance state using tri-state buffers (not shown in the figure), which act as open switches for temporarily disconnecting the driver circuit 116 and the speaker 102 from the rest of the components of the audio subsystem 100. The first pair of switches 146 is then closed, enabling the integrator-offset loops 202 between output terminals 204-1 and 204-2 of the integrator 112 and the input terminals 124-1 and 124-2. In one embodiment, digital controllers 206-1 and 206-2, collectively referred to as the controllers 206, control the first pair of switches 146. In another embodiment, the first pair of switches 146 can be hardwired. The digital controllers 206 may also be configured to power down the modulation circuit 114 and put the driver circuit 116 and the speaker 102 in a high impedance state.

When the integrator-offset loops 202 are enabled, the offset voltage Vi 136 appears at the output terminals 204-1 and 204-2. The offset voltage Vi 136 is sensed by the controllers 206, which are coupled to the corresponding integrator-offset loops 202 and summing amplifiers 208-1 and 208-2. The summing amplifiers 208-1 and 208-2 are collectively referred to as summing amplifiers 208. In one implementation, the summing amplifiers 208 are operational amplifiers coupled between the input source 106 and the integrator 112. In another implementation, if the input Vin 108 comes from a digital sub-system, the summing amplifiers 208 may be replaced by digital adders. The summing amplifiers 208 are used to sum different voltages together, such as the Vin 108 and the respective offset-cancellation signals 210-1 and 210-2, collectively referred to as offset-cancellation signals 210, provided by the controllers 206.

The offset-cancellation signals 210 are voltages calculated by the controllers 206 based on the amplified Vi 136 such that when provided at the input of the integrator 112, the offset-cancellation signals 210 nullify the Vi 136 at the output of the integrator 112. In one implementation, the controllers 206 use approximation algorithms, such as a successive approximation (SAR) algorithm, to calculate the offset-cancellation signals 210. In other implementations, different methods of numerical approximation, such as linear approximation and quadratic approximation can also be used.

The summing amplifiers 208 add the offset-cancellation signals 210 and Vin 108 and provide the summation as an input voltage to the integrator 112. The input voltage of the integrator 112 is thus made equal to zero Volts during powering-up and equal to the Vin 108 during the normal operating mode of the audio amplifier 104. Once the offset-cancellation signals 210 are calculated and provided to the summing amplifiers 208, the first pair of switches 146 is opened by the controllers 206, thus disabling the integrator-offset loops 202. The controllers 206 also store the offset-cancellation signals 210 in a memory unit (not shown in the figure) and provide the offset-cancellation signals 210 to the summing amplifiers 208 during the next stage of calibration and during normal operating mode of the audio amplifier 104.

Hence, the output received at the output terminals 204-1 and 204-2 of the integrator 112 is at zero volts when no input signal is provided, for example, during powering-up. Further, the output received at the output terminals 204-1 and 204-2 of the integrator 112 is at the voltage Vo 134 during the normal operating mode of the audio amplifier 104. Consequently, the pop-up noise at the speaker 102 due to the offset voltage Vi 136 during powering-up is reduced.

The offset Vi 136 due to the integrator 112 can be calibrated for correction every time the audio amplifier 104 starts up or is un-muted. The audio subsystem 100 is can be used in portable systems having a class-D amplifier. The scheme for pop-up noise reduction is further appreciated in devices, implementing the audio subsystem 100, that already have an inbuilt controller. The same inbuilt controller can be used to control the operation of the first pair of switches 146. Hence, the audio subsystem 100 implements a low-cost solution to the pop-up noise by utilizing the resistors 144, the first pair of switches 146 and already available components, such as the controllers, of the devices.

Figure 3:
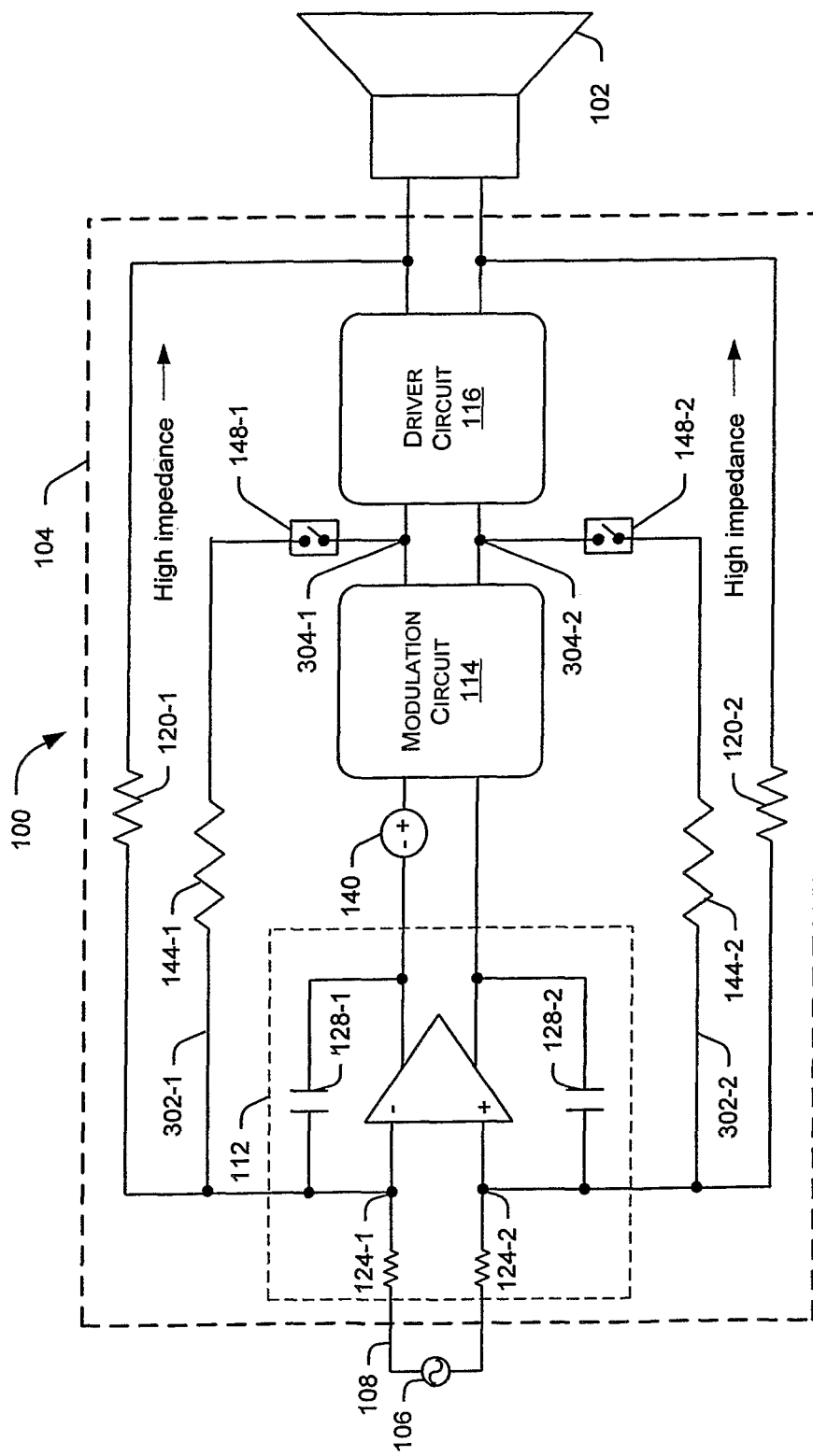
FIG. 3 illustrates an exemplary audio subsystem implementing a scheme for offset calibration of a comparator, according to an embodiment of the present subject matter.

FIG. 3 illustrates the exemplary audio subsystem 100 implementing a scheme for offset calibration of one or more comparators (not shown in the figure) of the modulation circuit 114, according to an embodiment of the present subject matter. As discussed earlier, the calibration of the offset Vc 140 of the one or more comparators can be done in the second stage of the offset calibration for the audio amplifier 104, for example, after the offset Vi 136 of the integrator 112 has been calibrated in the first stage of offset calibration. The offset Vc 140 is an effective offset voltage of the comparators that appears across the speaker 102. The Vc 140 may cause a pop-up noise in an output of the speaker 102 during powering-up of the audio amplifier 104. As discussed, to reduce the pop-up noise at the speaker 102, the offset correction loops 142 are provided in the audio amplifier 104.

In one embodiment, the offset correction loops 142 include sub-feedback loops, such as a first comparator-offset loop 302-1 and a second comparator-offset loop 302-2, collectively referred to as comparator-offset loops 302. Further, the comparator-offset loops 302 include the resistors 144 and the second pair of switches 148. The comparator-offset loops 302 are used to calibrate the offset Vc 140 of the comparators during powering-up or un-muting, i.e., before the audio amplifier 104 is put in the normal operating mode.

For the purpose, the modulation circuit 114, which was powered down in the first stage, is powered up, while the driver circuit 116 is kept in a high impedance state. The second pair of switches 148 are then closed, thus enabling the comparator-offset loops 302 between output terminals 304-1 and 304-2 of the modulation circuit 114, and the input terminals 124-1 and 124-2. In one implementation, controllers, such as the digital controllers 206, control the second pair of switches 148. In another implementation, the second pair of switches 148 can be hardwired.

When the comparator-offset loops 302 are enabled, the Vc 140 appears at the output terminals 304-1 and 304-2 instantaneously. The capacitors 128, which are coupled to the comparator-offset loops 302, also receive the Vc 140 instantaneously and are charged to a voltage potential equal to a negative value of the offset voltage Vc 140. The negative potential is provided at the input of the modulation circuit 114, hence driving the offset Vc 140 at outputs 304 close to zero. The comparator-offset loops 302 are enabled to operate for an offset correction time interval during which the offset voltage Vc 140 is nullified by the negative feedback provided to the comparators of the modulation circuit 114 via the capacitors 128. The offset correction time can be calculated using the formula (1):

$$t = \frac{k}{2\pi * BW} \quad (1)$$

where BW is a bandwidth of the comparator-offset loops 302 and k is a number, for example, between 3 and 5. The bandwidth can be calculated based on the values of the capacitors 128 and the resistors 144 used in the audio subsystem 100 as known in the art. Due to the use of the comparator-offset loops 302, the offset Vc 140 is calibrated by the capacitors 128 without the Vc 140 appearing across the speaker 102 as opposed to the conventional system, where the Vc 140 would have appeared across the speaker 102 had the normal overall feedback loop 118 been used to calibrate the Vc 140.

Thus, the offset voltage Vc 140 is calibrated by providing a negative feedback to the comparators for a predetermined time during which the driver circuit 116 and the speaker 102 are disconnected from the device 100, thereby preventing the Vc 140 from appearing across the speaker 102. After the predetermined time expires, the second pair of switches 148 is opened, thus disabling the comparator-offset loops 302. Once the second stage of offset calibration is over, the driver circuit 116 is removed from the high impedance state and the audio amplifier 104 is allowed to operate in the normal operating mode.

Thus in the normal operating mode, both the offsets Vi 136 and Vc 140 get nullified due to the offset-cancellation signals 210 and the potential stored in the capacitors 128, respectively. As a result, no pop-up noise is produced from the speaker 102 on being powered up or un-muted.

Figure 4:
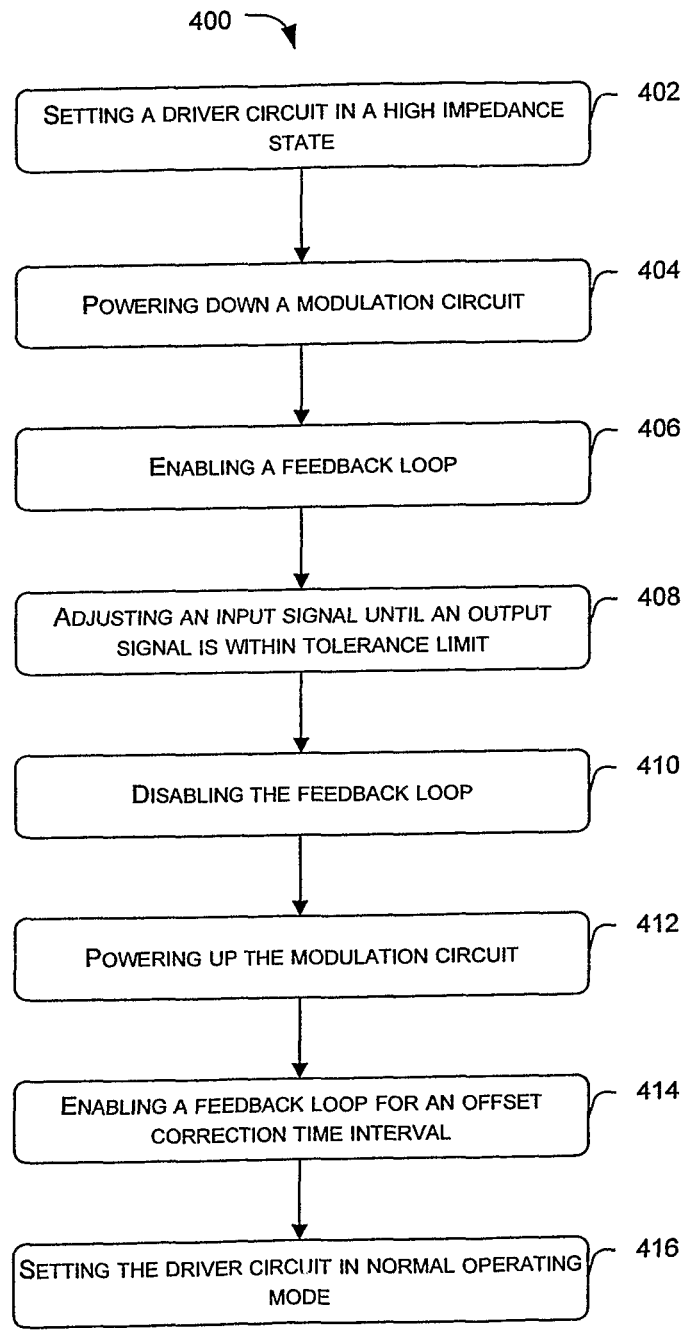
FIG. 4 illustrates an exemplary method for offset calibration in an audio amplifier, according to an embodiment of the present subject matter.

FIG. 4 illustrates an exemplary method 400 for offset calibration in the audio amplifier 104, according to an embodiment of the present subject matter. The order in which the method is described is not intended to be construed as a limitation, and any number of the described method blocks can be combined in any order to implement the method, or an alternate method. Additionally, individual blocks may be deleted from the method without departing from the spirit and scope of the subject matter described herein.

Further, the method is explained with respect to an embodiment of the present subject matter, however, as will be understood by a person having ordinary skills in the art, the method can be used in various other devices. Furthermore, the methods can be implemented in any suitable hardware, software, firmware, or a combination thereof.

At block 402, a driver circuit 116 is put in a high impedance mode to prevent the transfer of the integrator and comparator offsets, Vi 136 and Vc 140, to the load. In one implementation, the driver circuit 116 is put in the high impedance state using tri-state buffers (not shown in the figure), which act as open switches, hence temporarily disconnecting the driver circuit 116 and the load, such as a speaker 102 from rest of the components of the audio subsystem 100.

At block 404, the modulation circuit 114 is powered down to prevent the generation of the offset Vc 140 during a first stage of offset calibration. As explained earlier, the first stage of offset calibration involves calibration of the integrator offset Vi 136.

At block 406, an integrator feedback loop is enabled to begin the first stage of offset calibration. In one embodiment, the integrator feedback loop, such as the integrator-offset loop 202-1 and the integrator-offset loop 202-2 are enabled between output terminals 204-1 and 204-2 of the integrator 112 and the input terminals 124-1 and 124-2 by closing the first pair of switches 146 for the first stage of offset calibration. In an embodiment, controllers, such as the digital controllers 206 can be used to control the first pair of switches 146. As the integrator-offset loops 202 are enabled, the offset Vi 136 appears across the output terminals 204-1 and 204-2 and can be measured by the controllers 206.

At block 408, the controllers 206 adjust an input signal Vin 108 until an output signal such as the offset Vi 136 is within tolerance limit. The controllers 206 provide offset-cancellation signals 210-1 and 210-2 to the summing amplifiers 208-1 and 208-2 based on an input signal, such as the offset Vi 136, such that the offset-cancellation signals 210-1 and 210-2 can nullify the offset Vi 136. For the purpose, the controllers 206 use algorithms, such as a successive approximation algorithm, to adjust the offset-cancellation signals 210-1 and 210-2 until the offset Vi 136 is nullified.

Once the offset Vi 136 is nullified by the offset-cancellation signals 210-1 and 210-2, the method 400 proceeds to block 410, where the controllers 206 disable the integrator-offset loops 202 by opening the first pair of switches 146. The offset-cancellation signals 210-1 and 210-2 are further stored in the controllers 206 so that the offset-cancellation signals 210 can be provided during subsequent calibration steps and during the normal operating mode of the audio amplifier 104.

At block 412, the modulation circuit 114, which was powered down in the first stage, is powered up to begin the second stage of offset calibration to calibrate the offset Vc 140 of the comparators of the modulation circuit 114.

At block 414, a feedback loop is enabled, for an offset correction time interval, to begin the second stage of offset calibration. In one embodiment, the modulation circuit feedback loop, such as the comparator-offset loops 302 are enabled between the output terminals 304-1 and 304-2 of the modulation circuit 114 and the input terminals 124. This is done by closing the second pair of switches 148. As the comparator-offset loops 302 are enabled, the Vc 140 appears across the capacitors 128 coupled to the comparator-offset loops 302. The capacitors then get charged to a voltage potential equal to the negative of the offset voltage Vc 140. As explained earlier, the comparator-offset loops 302 are enabled for the offset correction time interval during which the offset Vc 140 is calibrated. After calibration of the offset Vc 140, the comparator-offset loops 302 are disabled by opening the second pair of switches 148.

At block 416, the driver circuit 116 is set in the normal operating mode. The driver circuit 116 is removed from the high impedance state, thus connecting the load, such as the speaker 102 to the audio amplifier 104, and the audio amplifier 104 is operated in the normal operating mode.

CONCLUSION

Although embodiments for reduction of pop-up noise in a device have been described in language specific to structural features and/or methods, it is to be understood that the appended claims are not necessarily limited to the specific features or methods described. Rather, the specific features and methods are disclosed as exemplary implementations for the same.

We claim:

1. A device comprising:
an integrator operative to amplify an input signal;
a modulation circuit operative to modulate an amplified input signal received from the integrator;
an integrator-offset feedback loop selectively connected across the integrator and operative to bias the integrator input so as to counter an offset voltage in the integrator; and
a comparator-offset feedback loop, including a capacitor, selectively connected across the modulation circuit and operative to bias the modulation circuit input so as to counter a comparator offset voltage in the modulation circuit.

2. The device as claimed in claim 1, further comprising a driver circuit coupled to the modulation circuit, wherein the driver circuit is placed in a high impedance state during an operation of the feedback loop.

3. The device as claimed in claim 2, wherein the comparator-offset loop comprises capacitors operative to charge to a voltage that counters the comparator offset voltage in the modulation circuit.

4. The device as claimed in claim 3, wherein the comparator-offset loop is connected across the modulation circuit for a sufficient duration to charge the capacitors to the counter voltage prior to enabling the driver circuit.

5. The device as claimed in claim 1, wherein the device further comprises at least one controller coupled to the integrator-offset loop, wherein the controller senses an offset detected by the integrator-offset loop and provides an offset-cancellation signal to nullify the offset.

6. The device as claimed in claim 5, wherein the controller is configured to power down the modulation circuit during an operation of the integrator-offset loop.

7. The device as claimed in claim 1, wherein the device is selected from a group consisting of home entertainment devices, audio players, video players, amplification systems, computing devices, laptops, and communication devices.

8. An audio subsystem comprising:
an integrator operative to amplify an input signal;
an integrator-offset feedback loop selectively connected across the integrator and operative to detect an offset in an output of the integrator; and
a controller coupled to the integrator-offset loop and operative to sense the offset detected by the integrator-offset loop, wherein the controller is further operative to generate an offset-cancellation signal, based on the detected offset, to nullify the offset.

9. The audio subsystem as claimed in claim 8, further comprising:
a modulation circuit operative to receive the amplified input signal, wherein the modulation circuit is operative to modulate the amplified input signal; and
a driver circuit coupled to the modulation circuit;
wherein the modulation circuit is powered down and the driver circuit is put in a high impedance state during an operation of the integrator-offset loop.

10. The audio subsystem as claimed in claim 8, wherein the controller is coupled to at least one summing amplifier to provide the offset-cancellation signal to an input of the integrator.

11. The audio subsystem as claimed in claim 8, wherein the controller includes a memory unit to store the offset-cancellation signal.

12. The audio subsystem as claimed in claim 8, wherein the integrator-offset loop comprises a switch controlled by the controller to enable and disable the integrator-offset loop.

13. An audio subsystem comprising:
a modulation circuit operative to modulate an input signal;
at least one comparator-offset feedback loop, including a capacitor, selectively connected across the modulation circuit and operative to counter an offset voltage in an output of the modulation circuit; and
at least one capacitor coupled to the comparator-offset loop, wherein the capacitor is charged to a potential equal to a negative value of the offset voltage to nullify the offset voltage.

14. The audio subsystem as claimed in claim 13, further comprising a driver circuit coupled to the modulation circuit, wherein the driver circuit is placed in a high impedance state during an operation of the comparator-offset loop.

15. The audio subsystem as claimed in claim 13, wherein the comparator-offset loop comprises a switch configured to enable the comparator-offset loop for an offset correction time interval.

16. The audio subsystem as claimed in claim 13, wherein the modulation circuit comprises one or more comparators.

17. A method of calibrating an audio circuit to reduce pop-up noise, comprising:
setting a driver circuit in a high impedance state;
enabling an integrator-offset feedback loop selectively connected across an integrator;
detecting an offset in an output signal of the integrator;
generating offset-cancellation signals based on the detected offset; and
providing the offset-cancellation signals to an input of the integrator.

18. The method as claimed in claim 17, wherein detecting the offset comprises powering down a modulation circuit.

19. The method as claimed in claim 17, further comprising:
powering up a modulation circuit; and
countering an offset voltage in an output of the modulation circuit by charging capacitors in a feedback loop to a potential equal to a negative value of the offset voltage.

* * * * *